United States Patent [19]

Vaughn, II et al.

[11] Patent Number: 5,741,975
[45] Date of Patent: Apr. 21, 1998

[54] MEDIA ISOLATED DIFFERENTIAL PRESSURE SENSOR AND FLUID INJECTION METHOD

[75] Inventors: John Howard Vaughn, II, Tempe, Ariz.; Donald Ora Myers, Cary, Ill.; Jeffrey Alan Bykowski, Franksville, Wis.

[73] Assignee: Motorola, Inc., Schaumburg, Ill.

[21] Appl. No.: 688,979

[22] Filed: Jul. 31, 1996

[51] Int. Cl.$^6$ ......................................................... G01L 7/00
[52] U.S. Cl. .................................................................. 73/706
[58] Field of Search ............................ 73/706, 715, 716, 73/717, 4 R, 756

[56] References Cited

U.S. PATENT DOCUMENTS

| | | |
|---|---|---|
| 4,370,890 | 2/1983 | Frick ........................................... 73/706 |
| 4,414,851 | 11/1983 | Maglic . |
| 4,425,799 | 1/1984 | Park . |
| 4,610,256 | 9/1986 | Wallace ........................................ 73/706 |
| 4,697,643 | 10/1987 | Sassier ......................................... 73/717 |
| 4,732,042 | 3/1988 | Adams . |
| 4,798,089 | 1/1989 | Frick et al. .................................. 73/715 |
| 4,833,922 | 5/1989 | Frick et al. .................................. 73/717 |
| 4,995,266 | 2/1991 | Tobita et al. ................................ 73/706 |
| 5,335,549 | 8/1994 | Kato ............................................. 73/706 |

*Primary Examiner*—William L. Oen
*Attorney, Agent, or Firm*—Jasper W. Dockrey

[57] ABSTRACT

A pressure sensor (10) includes a base (12) supporting a lead frame (28) having a pressure sensing element (14) electrically coupled to the lead frame (28). The molded base (12) interlocks with first and second diaphragm mounting frames (18, 20) and together with first and second diaphragms (22, 24) forms first and second chambers (36, 40). An incompressible fluid resides in the first and second chambers (36, 40) and transfers the pressure of a sensed media impinging on either of the first or second diaphragms (22, 24) to the pressure sensing element (14). The incompressible fluid filling the first and second chambers (36, 40), together with the flexible and impermeable membrane material of the first and second diaphragms (22, 24) effectively isolates the pressure sensing element (14) from the sensed media.

11 Claims, 7 Drawing Sheets

MEDIA ISOLATED DIFFERENTIAL PRESSURE SENSOR AND FLUID INJECTION METHOD

FIELD OF THE INVENTION

This invention relates in general to solid-state pressure sensors, and more particularly, to solid-state differential pressure sensors including means for protecting solid-state components from corrosive atmospheres, and to methods for injecting fluid into a pressure sensor.

Background of the Invention

Solid-state pressure sensors can be employed in a wide variety of applications in the automotive and industrial electronic field. Numerous applications for solid-state pressure sensors exist, in part, because they can be constructed in a small, compact configuration. Additionally, the electronic components contained within a solid-state pressure sensor are compatible with electronic systems used in automobiles and industrial electronic applications. Although solid-state pressure sensors have great utility, the electronic components within the sensors can be easily damaged upon exposure to a corrosive gas atmosphere for pressure measurement.

To prevent exposure of internal electronic components within a solid-state pressure sensor to corrosive gases, such as automobile exhaust gases and the like, it is necessary to isolate the electronic components from the corrosive gases. For example, electronic components can be covered by die-coat materials, such as epoxies, polyimides, and the like. However, die-coat materials are often permeable to corrosive gases, or they are adversely affected by corrosive gases. Once a corrosive gas penetrates the die-coat, the integrity of the underlying electronic component can be compromised. Severe exposure to, for example, hydrocarbon gases, can cause output signals of the electronic component to be unstable and to drift erratically.

To enhance the isolation of internal electronic components, the electronic components can be immersed in a pressure transfer medium or material. For example, U.S. Pat. No. 4,732,042 to V. J. Adams and commonly assigned to the assignee named herein discloses the use of a pressure transfer material over a pressure sensing element. This technique offers a substantial improvement over die-coat materials and effectively isolates the upper portion of a pressure sensing element from corrosive gases. A pressure sensing membrane, or diaphragm, overlies the pressure transfer medium. Atmospheric pressure impinging on the diaphragm is transferred by the pressure transfer medium to the pressure sensing element. The pressure transfer medium and the diaphragm function to isolate the underlying pressure sensing element from corrosive gases impinging on the diaphragm. In view of the significant advantages provided by a solid-state pressure sensor having a pressure sensing element submerged in a pressure transfer medium, further development work is desired to enhance the utility and further improve the isolation characteristics of such solid-state pressure sensors.

It will be appreciated that for simplicity and clarity of illustration, elements shown in the Figures have not necessarily been drawn to scale. For example, the dimensions of some of the elements are exaggerated relative to each other. Further, where considered appropriate, reference numerals have been repeated among the Figures to indicate corresponding elements.

DETAILED DESCRIPTION OF PREFERRED EMBODIMENTS

The present invention is for a pressure sensor that can be used to sense the pressure of highly corrosive media, such as automobile exhaust gases, vacuum pressure within an automobile gas manifold, and the like. The pressure sensor provides an electrical signal corresponding to the pressure difference between two sensed media. For example, one sensed media can be the gases within an automobile manifold, while the other sensed media can be the ambient atmosphere surrounding the sensor. The pressure sensor of the invention advantageously isolates the sensed media from electronic components within the sensor. By isolating electronic components from the corrosive environment in which the sensor is intended to function, long term reliability of the sensor is improved. Furthermore, the pressure sensor of the invention contains multiple diaphragms that provide insurance against a system leak between the differential sensed media in the event of the failure of one diaphragm. A method is described for injecting incompressible fluid into the pressure sensor, such that air is simultaneously forced out of the sensor.

Figures 1, 2:
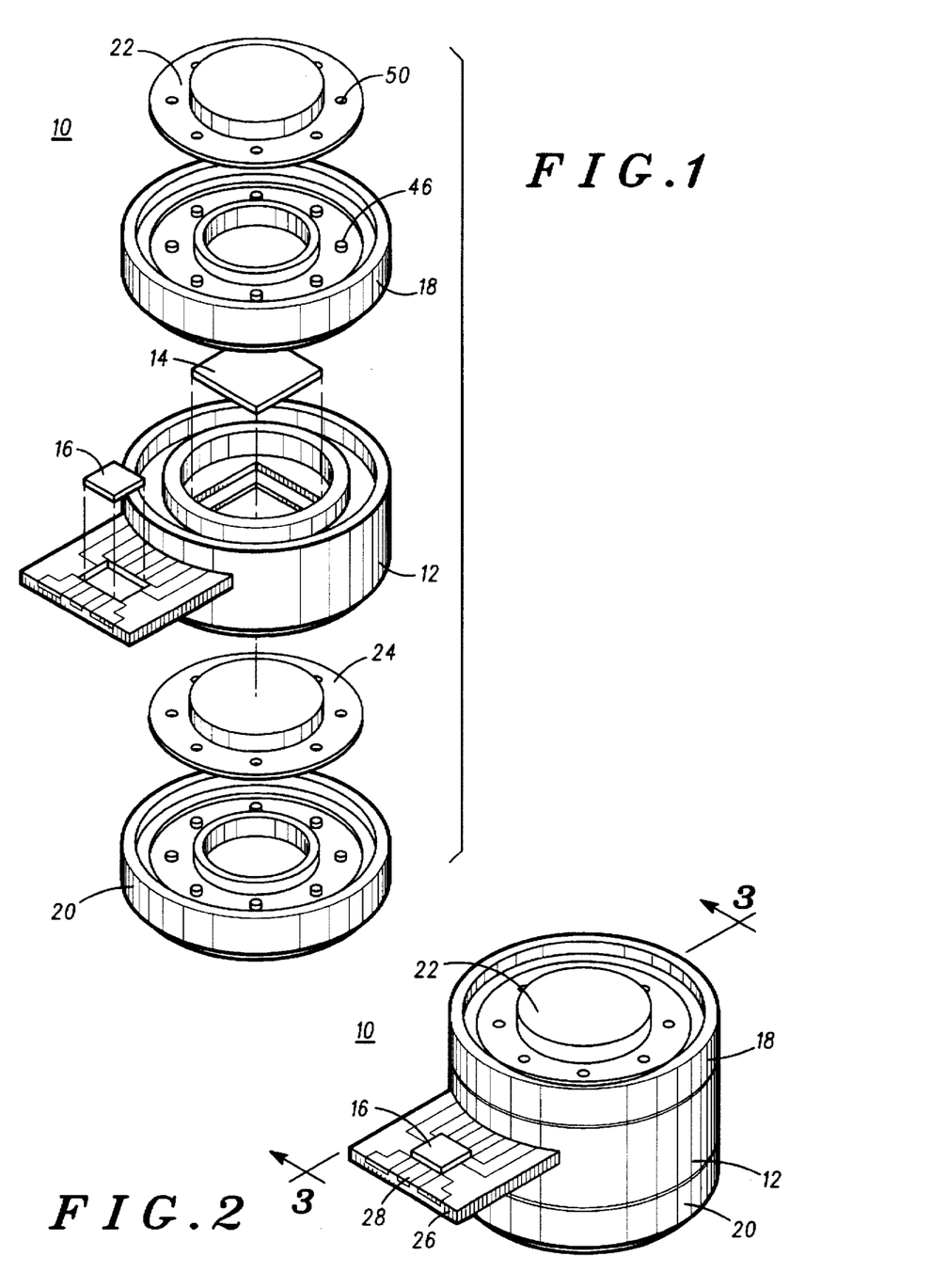
FIG. 1 is an exploded perspective view illustrating the elements of a pressure sensor in accordance with one embodiment of the invention.
FIG. 2 is a perspective view of the assembled pressure sensor shown in FIG. 1.

FIG. 1 illustrates an exploded view of a pressure sensor 10 constructed in accordance with one embodiment of the invention. Pressure sensor 10 includes a molded base 12 containing a pressure sensing element 14 and an external electronic component 16. Pressure sensing element 14 is a solid state semiconductor element having a pressure sensing region on the top surface of the element, and a pressure sensing region on the bottom surface of the element. In this manner, pressure sensing element 14 can determine the differential pressure of two separate sensed media. To couple the pressure of separate sensed media to pressure sensing element 14, molded base 12 is configured for the attachment of a first diaphragm mounting frame 18 and a second diaphragm mounting frame 20. First diaphragm mounting frame 18 contains a first diaphragm 22, while second diaphragm mounting frame 20 contains a second diaphragm 24.

As will subsequently be described, the diaphragms are insert molded into the mounting frames at the time of forming the mounting frames. In a preferred embodiment, the diaphragms are locked in place by a plurality of studs 46 formed by plastic that is injected through a plurality of holes 50 in the diaphragms.

As illustrated by the perspective view of FIG. 2, first and second mounting frames 18 and 20 interlock with molded base 12 to form a "pill box" configuration. The interlocking mounting frames enclose pressure sensing element 14 between first and second diaphragms 22 and 24. The interlocking mounting frames and diaphragms further isolate pressure sensing element 14 from external electronic component 16, which is mounted on a platform 26 laterally extending from molded base 12. A lead frame 28 is mounted to molded base 12 and platform 26 to provide electrical conduits between pressure sensing element 14 and external electronic component 16. Preferably, lead frame 28 is insert molded to molded base 12.

Figure 3:
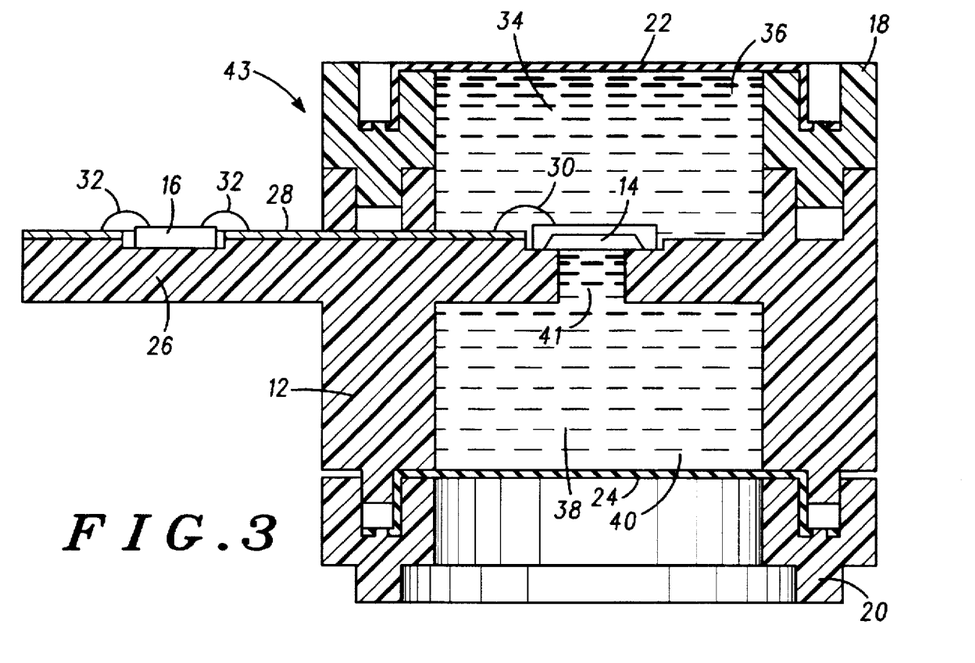
FIG. 3 is a cross-sectional view of the pressure sensor shown in FIG. 2, taken along section line 3—3.

A cross-sectional view of pressure sensor 10 is shown in FIG. 3 taken along section line 3—3 of FIG. 2. Wire bonds 30 electrically couple pressure sensing element 14 to lead frame 28, while wire bonds 32 electrically couple external electronic component 16 to lead frame 28. As further illustrated in FIG. 3, a first incompressible fluid region 34 resides in a first chamber 36. A second incompressible fluid region 38 resides in a second chamber 40. First chamber 36 is formed by first diaphragm mounting frame 18 interlocking with molded base 12 and first diaphragm 22. Correspondingly, second chamber 40 is formed by second diaphragm mounting frame 20 interlocking with molded base 12 and second diaphragm 24.

First and second incompressible fluid regions 34 and 38 are preferably of the same chemical composition and function to transmit the pressure of a sensed media impinging on diaphragms 22 and 24 to pressure sensing element 14. In a preferred embodiment of the invention, the incompressible fluid comprises silicone oil.

As illustrated in FIG. 3, first and second chambers 36 and 40 are of equal volume. When these chambers are filled with incompressible fluid, they provide protection to pressure sensing element 14 and wire bonds 30 from exposure to corrosive media, such as hot engine gases, and the like. Furthermore, by encapsulating pressure sensing element 14 in a low-viscosity, incompressible fluid, the entrapment of air bubbles within the fluid can be avoided. Entrapment of air bubbles can impose stress on the wire bonds, such as wire bonds 30, that electrically couple the pressure sensing element to external circuitry.

The pressure sensor of the invention is capable of simultaneously detecting a pressure difference between gaseous atmospheres impinging on first and second diaphragms 22 and 24. The pressure of a sensed media impinging on either diaphragm is transferred to pressure sensing element 14 by the incompressible fluid within chambers 36 and 40. First incompressible fluid region 34 contacts a measuring surface at the upper surface of pressure sensing element 14. Second incompressible fluid region 38 contacts a measuring surface at the bottom surface of pressuring sensing element 14 through a hole 41 in molded base 12. In addition to transferring pressure from the diaphragms, first and second incompressible fluid regions 34 and 38 function to encapsulate pressure sensing element 14. The immersion of pressure sensing element 14 in the incompressible fluid isolates the element from corrosive gases impinging on the diaphragms.

The encapsulation of pressure sensing element 14 is further enhanced by constructing first and second diaphragms 22 and 24 from a flexible, impermeable material. In a preferred embodiment, first and second diaphragms 22 and 24 are preferably a thin, flexible, stainless steel membrane having a thickness of about 0.002 inches. Alternatively, first and second diaphragms 22 and 24 can be a flexible, polymer membrane, such as polyimide, or "Mylar." To provide a gas impermeable seal, and to distribute shear stress, the diaphragms are insert molded to the corresponding diaphragm mounting frame and sealed with an adhesive.

Figure 4A:
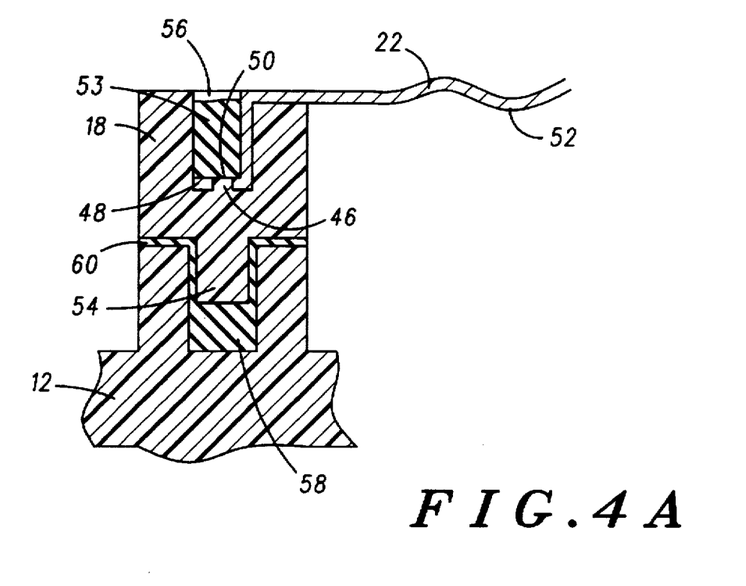
FIG. 4A–4D illustrate an exploded view of a region of the pressure sensor illustrated in FIG. 3 in accordance with various embodiments of the invention.
Figures 4B, 4C:
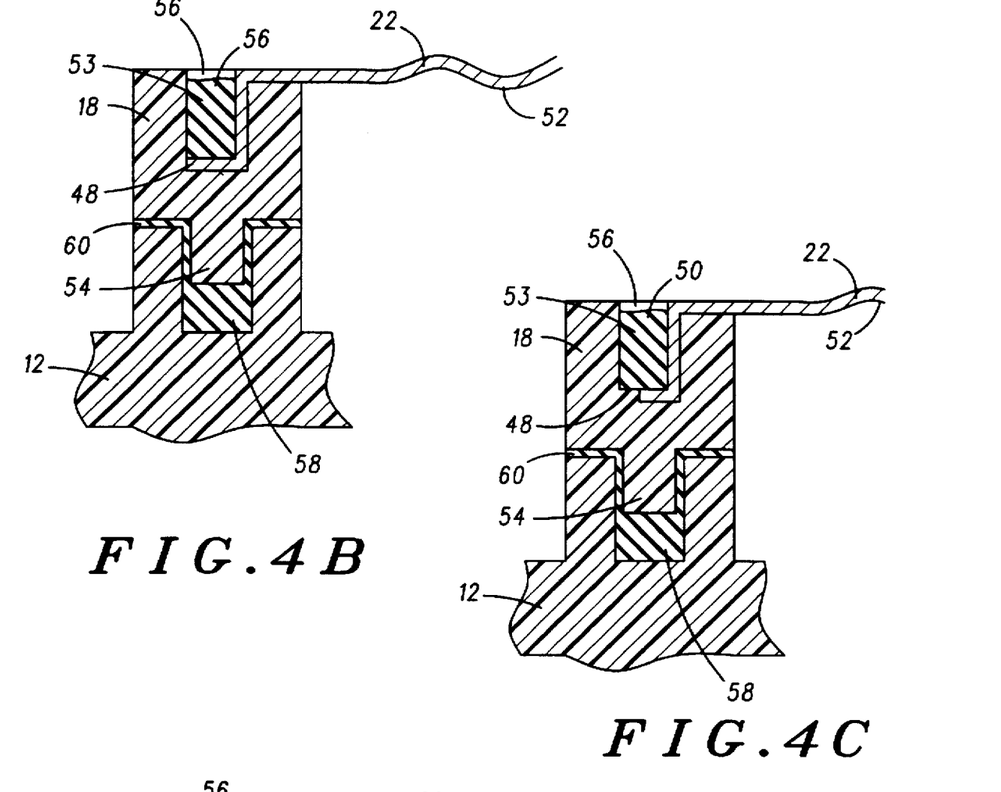
Figure 4D:
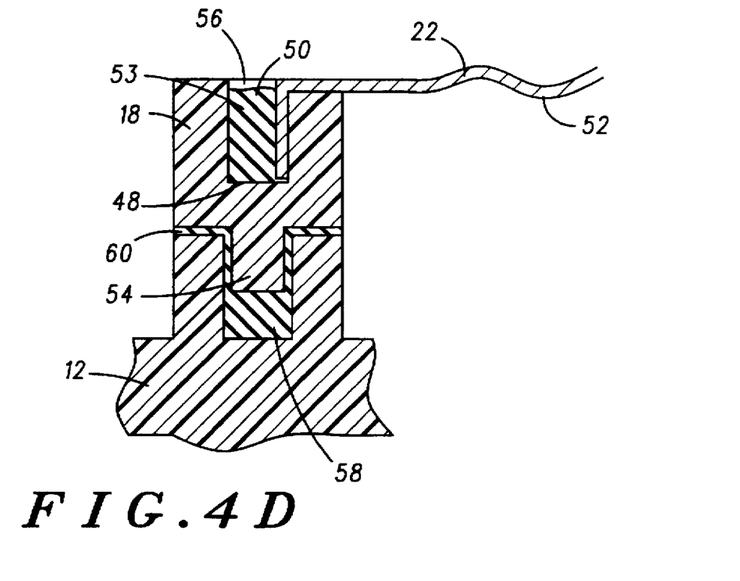

An exploded view of region 43 is shown in FIGS. 4a–4d illustrating various methods for attaching the diaphragms to the mounting frames. FIG. 4a illustrates a preferred embodiment including the injection molded attachment of first diaphragm 22 to first diaphragm mounting frame 18. By an injection molding process, a plurality of studs 46 impingement lock first diaphragm 22 to a mounting surface 48 of first diaphragm mounting frame 18. Prior to insert molding first diaphragm mounting frame 18, a plurality of holes 50, shown in FIG. 1, are stamped into a peripheral portion of first diaphragm 22. During the insert molding process, plastic fills holes 50 and forms studs 46. The plastic relieves shear stress from the impingement joint at mounting surface 48 and transfers the stress to studs 46. An adhesive 53 is used to seal the diaphragm to the mounting frame. Further examples of attaching first diaphragm 22 to first mounting frame 18 are shown in FIGS. 4b–4d. In all cases, adhesive 53 is used to seal the diaphragm to the mounting frame. Adhesive 53 is applied to fill groove 56 further sealing the diaphragm and insuring against leakage of incompressible fluid from first chamber 36.

In the present invention, it is important that allowance be made for the thermal expansion of first and second incompressible fluid regions 34 and 38. Accordingly, first and second diaphragms 22 and 24 are constructed to have a series of flexures creating a corrugated surface, as shown in FIG. 4a. Flexures 52 respond to expansion pressure of the first incompressible fluid region 34 and extend the surface area of first diaphragm 22. By permitting the diaphragms to expand, flexures 52 avoid unwanted thermal expansion pressure on pressure sensing element 14. Additionally, flexures 52 avoid unwanted pressure build-up within first and second chambers 36 and 40 and the possible rupture of pressure sensor 10.

The enclosure of pressure sensing element 14 is further assisted by the interlocking tongue and groove mechanism of first and second diaphragm mounting frames 18 and 20 with molded base 12. As illustrated in FIG. 4a, first diaphragm mounting frame 18 includes a tongue 54 opposite from a channel (or groove) 56 inserting into a groove 58 in base 12. An adhesive 60 further seals the interlocking components to form an impermeable wall of first chamber 36. Preferably, adhesives 53 and 60 are an adhesive compound, such as a silicone adhesive sold by Dow Corning Corp., of Midland, Michigan, under the trademarks "Sylgard 577" and "Dow Corning Q3-6611."

The symmetrical geometric configuration of first and second diaphragm mounting frames 18 and 20 enables these frames to be manufactured using a single mold. Since the diaphragm is an integral part of the frame, it can be assembled to the base using conventional, high-volume, bowl-feeding techniques. Moreover, the symmetrical geometric design of the mounting frames permits additional mounting frames and diaphragms to be interlocked together to form multiple chambers on each side of pressure sensing element 14 (not shown).

The encapsulation of pressure sensing element 14 is accomplished by simultaneously filling first and second chambers 36 and 40 with an incompressible fluid, while forcing air out of the chambers. The movement of liquid and air through first and second chambers 36 and 40 is facilitated by providing fluid transfer ports and plug openings in molded base 12.

Figure 5:
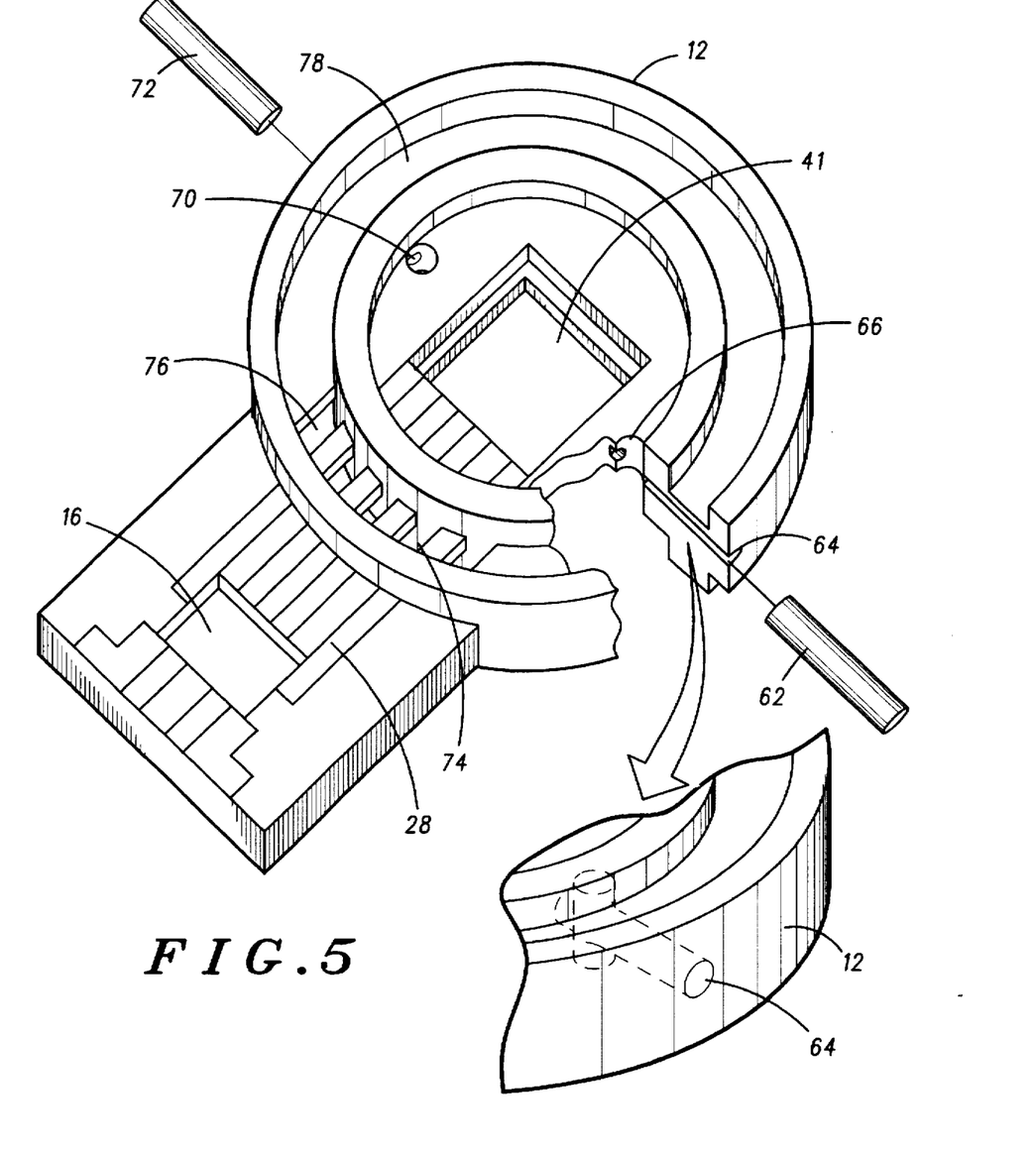
FIG. 5 is a partial cut-a-way perspective view of the central section of the pressure sensor shown in FIG. 1.

FIG. 5 shows a perspective view of molded base 12. The introduction of an incompressible fluid into first and second chambers 36 and 40 and the expulsion of air within the chambers is accomplished through first and second plug openings 64 and 68, and first and second fluid transfer ports 66 and 70. Molded base 12 is designed such that plug openings 64 and 68 orthoganally intersect first and second fluid transfer ports 66 and 70, respectively.

To begin the fluid filling process, the sensor is turned on its side so that one opening and port, for example first plug opening 64 and first fluid transfer port 66, are below the other opening and port. The incompressible fluid is then injected into first and second chambers 36 and 40 by inserting an elongated device (not shown), such as a funnel, or a pipette, or the like, through first plug opening 64. The incompressible fluid enters first and second chambers 36 and 40 through first fluid transfer port 66. At the same time that incompressible fluid is being injected through plug opening 64, air is being forced out of first and second chambers 36 and 40 through second plug opening 68. The air within first and second chambers 36 and 40 exits through second plug opening 68 by way of a second fluid transfer port 70. As the filling process proceeds, incompressible fluid fills both first and second chambers 36 and 40 and incompressible fluid freely flows between first and second chambers 36 and 40 through fluid transfer ports 66 and 70.

Once first and second chambers 36 and 40 are completely filled with incompressible fluid, insertable plugs 62 and 72 are inserted into first and second plug openings 64 and 68 respectively and heated to seal the plugs into plug openings 64 and 68, respectively. The heating process partially melts the plastic construction of insertable plugs 62 and 72 and molded base 12. Thus, insertable plugs 62 and 72 are press fit and heat staked to molded base 12 preventing the leakage of incompressible fluid from first and second chambers 36 and 40. Furthermore, once insertable plugs 62 and 72 are in place, fluid transfer between chambers 36 and 40 is prevented. To isolate the chambers, each insertable plug traverses the orthaganally oriented fluid transfer port and inserts into base 12 at a position opposite the plug opening.

In addition to heat staking insertable plugs 62 and 72 to molded base 12, a portion 74 of lead frame 28 traversing channel 78 is sealed by introducing an adhesive through opening 76 in channel 78. The adhesive is injected through opening 76 such that it completely surrounds and seals lead frame portion 74 between first and second diaphragm mounting frames 18 and 20. By injecting adhesive through opening 76, possible fluid leakage along lead frame 28 is prevented.

Figure 6:
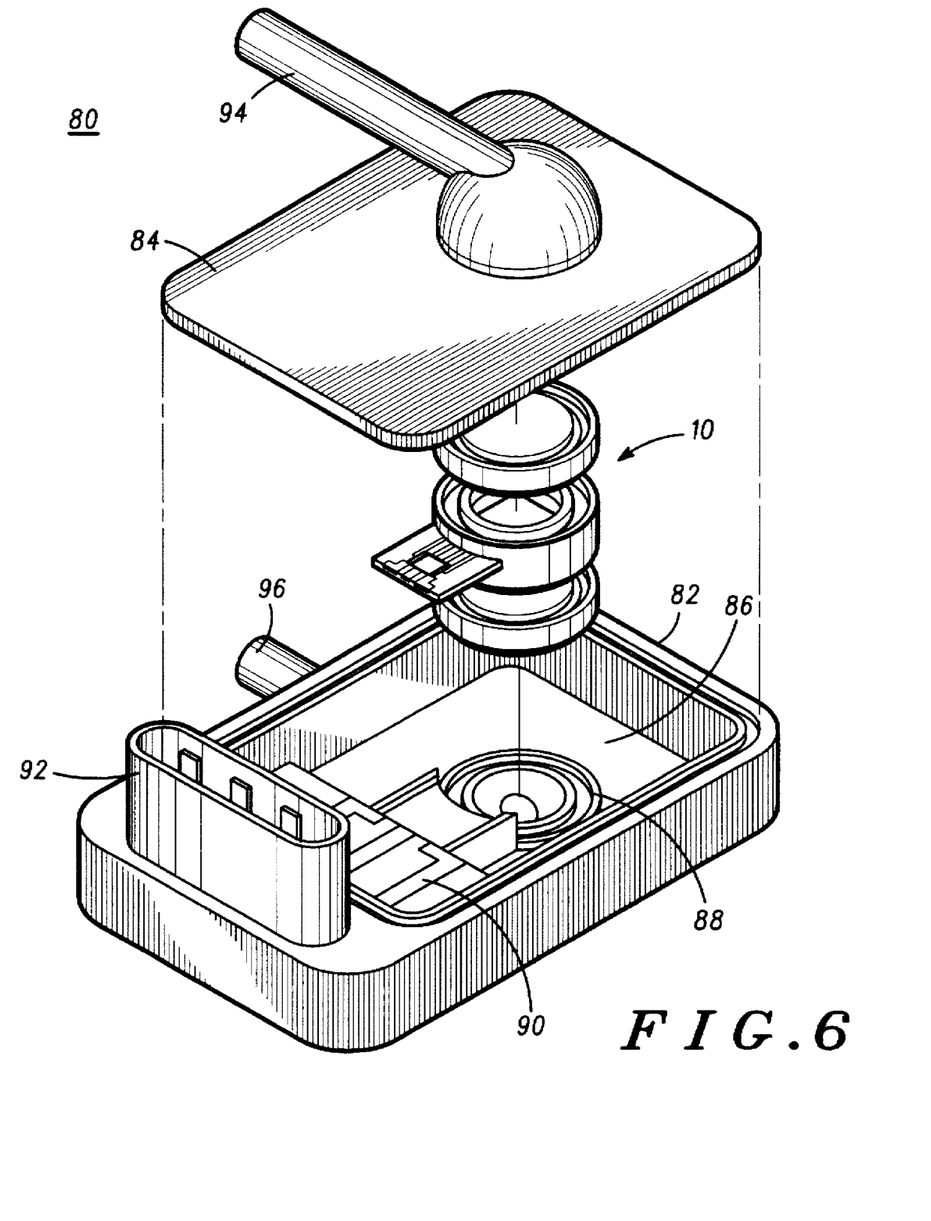
FIG. 6 is an exploded perspective view of the pressure sensor and housing arranged in accordance with one embodiment of the invention.

The compact and symmetrical shape of pressure sensor 10 permits the pressure sensor to be enclosed in various types of housings for the utilization of the pressure sensor in different applications. One example of a housing 80 for pressure sensor 10 is illustrated in the exploded view of FIG. 6. Housing 80 includes a bottom platform 82 and a top cover 84. Together top cover 84 and bottom platform 82 provide an outer protective mechanical shell that surrounds pressure sensor 10. Pressure sensor 10 is mounted within a main interior cavity 86 of bottom platform 82. Bottom platform 82 includes a mounting ring 88 configured to accept adhesive and to interlock with the tongue of first diaphragm mounting frame 20. Additionally, bottom platform 82 contains electrical connections 90 for electrically coupling to lead frame 28. Electrical communication with external circuitry can be provided through electrical wires (not shown) routed through conduit 92. Pressure conducting ports 94 and 96 connect housing 80 and pressure sensor 10 to external gaseous atmospheres. Housing 80 is constructed of a durable plastic material capable of withstanding harsh environments in which pressure sensor 10 is intended to function.

Figure 7:
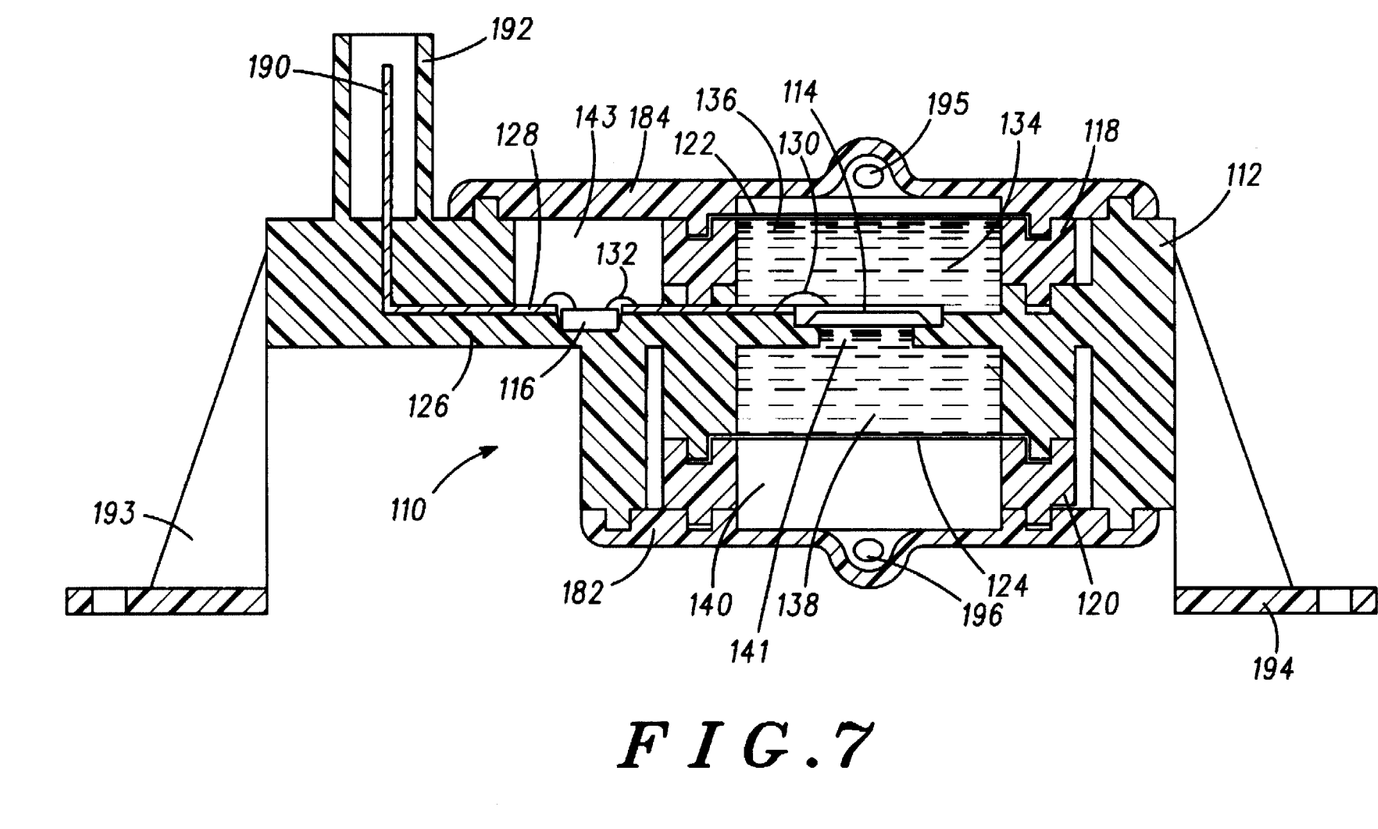
FIG. 7 is a cross-sectional view of a pressure sensor arranged in accordance with an alternative embodiment of the invention.
Figure 8:
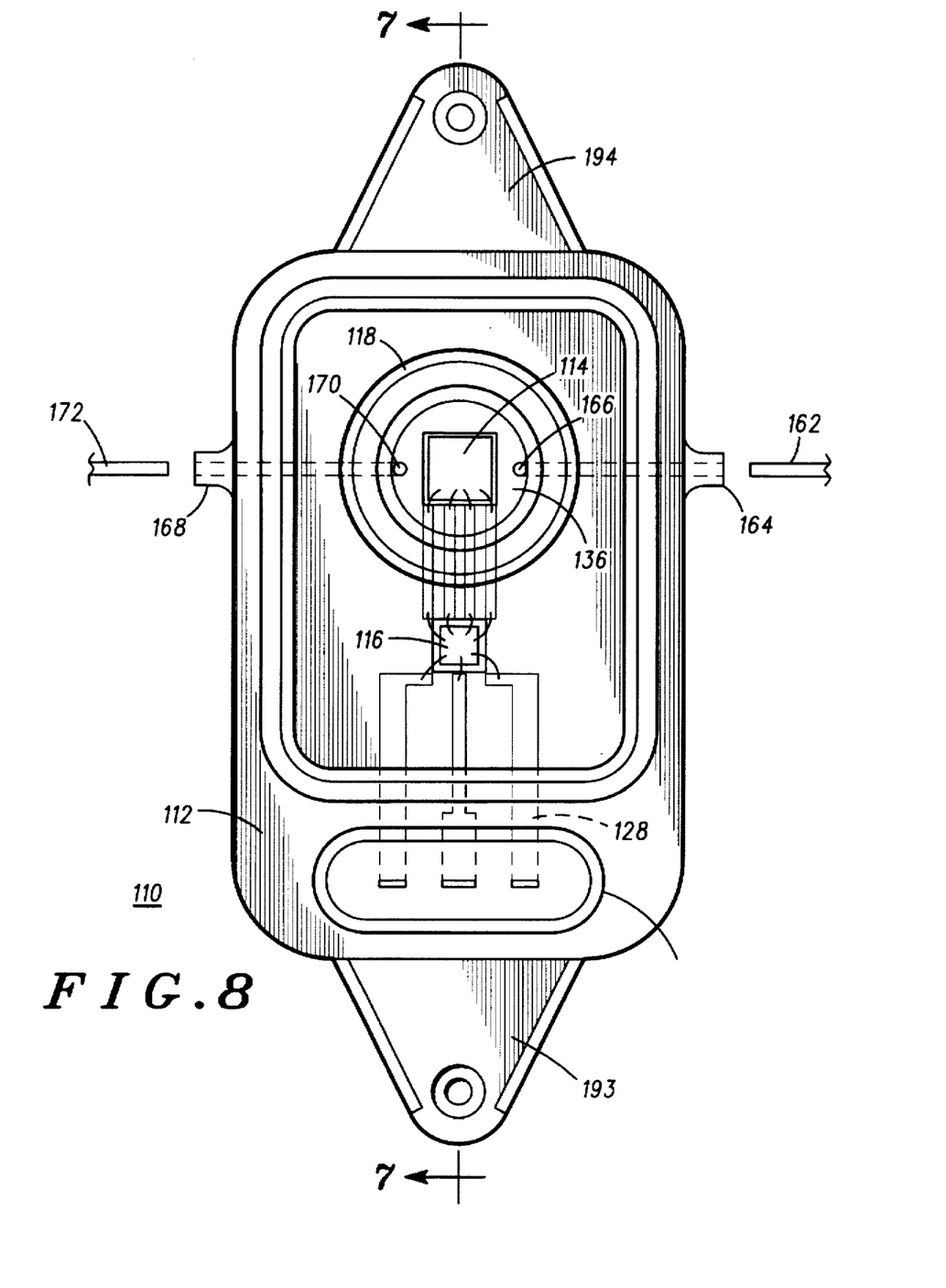
FIG. 8 is a top view of the pressure sensor arranged in accordance with the alternative embodiment.

An alternative embodiment of the invention is illustrated in FIGS. 7 and 8. In the alternative embodiment, a molded base 112 is configured to engage a top housing cover 184 and a bottom housing cover 182. Molded base 112 supports a lead frame 128 electrically connecting a pressure sensing element 114 and an external electronic component 116. Molded base 112 further includes a platform 126 supporting electrical connections 190, which extend vertically through a conduit 192. Wire bonds 130 and 132 electrically couple pressure sensing element 114 and external electronic component 116, respectively, to lead frame 128.

The pressure of external media is sensed by pressure sensing element 114 through pressure conducting ports 195 and 196. The interlocking of bottom housing cover 182 and top housing cover 184 to molded base 112 forms three internal chambers. First chamber 136 resides between top housing cover 184 and molded base 112. Second chamber 140 resides between bottom housing cover 182 and molded base 112, and a third chamber 143 resides between top housing cover 184 and molded base 112 and is further isolated from first chamber 136 by first diaphragm mounting frame 118.

A second diaphragm mounting frame 120 is interlocked with molded base 112 by the tongue and groove mechanism previously described. First diaphragm mounting frame 118 suspends a first diaphragm 122, and second diaphragm mounting frame 120 suspends a second diaphragm 124. A first incompressible fluid region 134 resides within first chamber 136 and transfers pressure of a sensed media entering first chamber 136 through pressure conducting port 195 to pressure sensing element 114. Similarly, a second incompressible fluid region 138 resides within second chamber 140 and transfers the pressure to pressure sensing element 114 of a sensed media entering second chamber 140 through pressure conducting port 196 and impinging on second diaphragm 124. Second incompressible fluid 138 contacts pressure sensing element 114 through an opening 141 in molded base 112.

Pressure sensor 110 can be mounted to a flat panel support using mounting brackets 193 and 194. The preferred method for injecting incompressible fluid into pressure sensor 110 according to the present embodiment is substantially similar to that described for pressure sensor 10 according to the previous embodiment. Incompressible fluid is introduced into first and second chambers 136 and 140 through first plug opening 164. Fluid passes into first and second chambers 136 and 140 through first fluid transfer port 166. Air within first chamber 136 and second chamber 140 exits through second plug opening 168. As described in the previous embodiment, once the chambers are filled with incompressible fluid, first and second insertable plugs 162 and 172 are inserted into first and second plug openings 164 and 168, respectively, and heat staked to the base by application of a thermal probe.

Pressure sensor 110 as configured in accordance with an alternative embodiment of the invention provides protection for pressure sensor 114 and external electronic component 116 by coupling a housing directly to the molded base. Thus, once pressure sensor 110 is assembled it is ready to be coupled to pressure transfer conduits and electrical connections, and to be mounted to a mounting site.

Those skilled in the art will appreciate that other configurations for the pressure sensor of the invention are possible, and those configurations will provide the same features and advantages as available in the embodiments previously described. In either of the foregoing embodiments, as a customizing processing step, the external electronic components can be exposed to a laser trimming tool to alter electrical circuit paths within the external electronic component. For example, selected resistors within the electronic component can be eliminated through application of laser light to the selected resistors. Further, the wire bonds electrically coupling the external electronic component to the lead frame can be protected by applying a bonding compound to the surface of the electronic component and surrounding the wire bond. For example, a polyimide material can be applied to the surface of the electronic component and covering the wire bonds.

Those skilled in the art will also recognize that advanced electronic configurations of the pressure sensor of the invention are possible. For example, the external electronic component can be an electrically-programmable-read-only-memory (EPROM) device. The use of an EPROM device eliminates the need to perform a laser trimming operation. In a further advanced electrical configuration, the pressure sensor of the invention can be assembled with a single electronic component. The single electronic component is an integrated circuit containing both EPROM memory rays and the electronic circuitry necessary for the pressure sensing function to be performed. Where a single electronic component is used, the electrical interconnections are simplified such that a lead frame would merely electrically connect the single electronic component to electric circuitry existing outside of the pressure sensor.

Thus it is apparent that there has been provided, in accordance with the invention, a media isolated differential pressure sensor that fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, moldable materials other than those described can be used to construct the body of the pressure sensor. Further, other types of impermeable membrane materials can be used. It is therefore intended to include within the invention all such variations and modifications as fall within the scope of the appended claims and equivalents thereof.

We claim:

1. A media isolated differential pressure sensor comprising:

a base having a first surface opposite a second surface;

a leadframe insert molded to the first surface;

a pressure sensing element mounted to the base and electrically connected to the leadframe, the pressure sensing element having a first pressure sensing region opposite a second pressure sensing region;

a first diaphragm mounting frame engaging the first surface of the base and having a first diaphragm insert molded thereto;

a first incompressible fluid region contacting the first pressure sensing region of the pressure sensing element and the first diaphragm;

a second diaphragm mounting frame engaging the second surface of the base having a second diaphragm insert molded thereto; and a second incompressible fluid region contacting the second diaphragm and contacting the second pressure sensing region through an opening in the base, wherein each of the first and second diaphragm mounting frames include a mounting surface having a groove for receiving the first and second diaphragms and an adhesive within the groove sealing the first and second diaphragms to the mounting surface, and wherein a plurality of insert molded studs contact the mounting surface through holes in a peripheral portion of the first and second diaphragms.

2. The pressure sensor of claim 1, wherein the first and second diaphragms comprise a material selected from the group consisting of a flexible stainless steel membrane and a flexible plastic film.

3. The pressure sensor of claim 1 further comprising:

a first cover sealed to the first surface of the base and to the first diaphragm mounting frame forming a first outer chamber for receiving a first sensed media, the first cover having a pressure port therein for conducting the first sensed media into the first outer chamber; and a second cover sealed to the second surface of the base and to the second diaphragm mounting frame and forming a second outer chamber for receiving a second sensed media, the second cover having a pressure port therein for conducting the second sensed media into the second outer chamber.

4. The pressure sensor of claim 3 further comprising external electronic circuitry, wherein a portion of the first cover engages the base and the first diaphragm mounting frame to form a third outer chamber enclosing the external electric circuitry.

5. The pressure sensor of claim 1, wherein the first and second incompressible fluid regions comprise silicone oil.

6. The pressure sensor of claim 1, wherein the leadframe is configured for electrically connecting the pressure sensing element to external electric circuitry, wherein the external electric circuitry comprises an electronic component mounted to the base and electrically connected to the leadframe, and wherein the base and the first and second diaphragm mounting frames seal the electronic component from the first and second incompressible fluid regions and from the first and second sensed media, respectively.

7. A media isolated differential pressure sensor comprising:

a base having a leadframe mounted thereon;

a pressure sensing element mounted to the base and electrically connected to the leadframe, the pressure sensing element in contact with a first fluid region at a first side thereof and in contact with a second fluid region at a second side thereof through a hole in the base;

a first mounting frame engaged with the base and having a first insert molded diaphragm in contact with the first fluid region and responsive to first sensed media; and a second mounting frame engaged with the base and having a second insert molded diaphragm in contact with the second fluid region and responsive to a second sensed media, wherein the base, the first and second mounting frames, the first and second fluid regions, and the first and second insert molded diaphragms isolate the pressure sensing element from the first and second sensed media, respectively, wherein each of the first and second diaphragm mounting frames include a mounting surface having a groove for receiving the first and second diaphragms and an adhesive within the groove sealing the first and second diaphragms to the mounting surface, and wherein a plurality of insert molded studs contact the mounting surface through holes in a peripheral portion of the first and second diaphragms.

8. The pressure sensor of claim 7, wherein the first and second fluid regions comprise silicone oil.

9. A media isolated differential pressure sensor comprising:

a base having first surface opposite a second surface;

a leadframe mounted on the first surface;

a pressure sensing element mounted to the first surface and electrically connected to the leadframe, the pressure sensing element having a first pressure sensing region opposite a second pressure sensing region;

a first mounting frame engaged with the first surface of the base;

a first diaphragm responsive to a first sensed media insert molded to the first mounting frame, wherein the first surface of the base, the first mounting frame and the first diaphragm form a first chamber;

a first incompressible fluid region filling the first chamber and contacting the first diaphragm and the first pressure sensing region of the pressure sensing element;

a second mounting frame engaged with the second surface of the base;

a second diaphragm responsive to a second sensed media insert molded to the second mounting frame, wherein the second surface of the base, the second mounting frame, and the second diaphragm form a second chamber; and a second incompressible fluid region filling the second chamber and contacting the second diaphragm and contacting the second pressure sensing region of the pressure sensing element through a hole in the base, wherein each of the first and second mounting frames include a mounting surface having a groove for receiving the first and second diaphragms and an adhesive within the groove sealing the first and second diaphragms to the mounting surface, and wherein a plurality of insert molded studs contact the mounting surface through holes in a peripheral portion of the first and second diaphragms.

10. The pressure sensor of claim 9 further comprising an opening in the first and second mounting frames and an exposed portion of the lead frame traversing the opening, wherein the adhesive fills the opening and covers the exposed portion of the leadframe.

11. A method for introducing a fluid into a media isolated differential pressure sensor comprising the steps of:

providing a pressure sensor housing having, a base having a first surface opposite a second surface, wherein the base contains first and second fluid transfer ports extending from the first surface to the second surface, and wherein the floor surface contains first and second plug openings orthoganally intersecting the first and second fluid transfer ports, respectively, a first diaphragm mounting frame engaging the first surface of the base and having a first diaphragm insert molded thereto defining a first fluid chamber, a second diaphragm mounting frame engaging the second surface of the base having a second diaphragm insert molded thereto defining a second fluid chamber, wherein the first and second fluid chambers communicate through the first and second fluid transfer ports;

rotating the pressure sensor, such that the first plug opening is below the second plug opening;

introducing a fluid into the first and second fluid chambers through the first plug opening, wherein fluid transfers to the first and second fluid chambers through the first fluid transfer port, and wherein air is forced out of the first and second fluid chambers through the second fluid transfer port and the second plug opening; and inserting plugs into the first and second plug openings, wherein the plugs traverse the first and second fluid transfer ports and isolate the first fluid chamber from the second fluid chamber.

* * * * *